United States Patent [19]

Matsubara et al.

[11] Patent Number: 5,166,550

[45] Date of Patent: Nov. 24, 1992

[54] COMPARATOR CIRCUIT WITH VARIABLE HYSTERESIS CHARACTERISTIC

[75] Inventors: Kunihiro Matsubara, Seto; Katsuya Shimizu, Kasugai, both of Japan

[73] Assignee: Fujitsu Limited, Kawasaki, Japan

[21] Appl. No.: 635,078

[22] Filed: Dec. 28, 1990

[30] Foreign Application Priority Data

Dec. 28, 1989 [JP] Japan .................................. 1-344084

[51] Int. Cl.$^5$ ..................... H03K 5/153; H03K 5/159; H03K 5/22; H03K 5/08
[52] U.S. Cl. .................................. 307/356; 307/352; 307/354; 307/359; 307/364; 307/491; 307/494; 307/552
[58] Field of Search ............... 307/352, 354, 356, 359, 307/364, 491, 494, 552; 328/147

[56] References Cited

U.S. PATENT DOCUMENTS 4,068,138  1/1978  Miyakawa et al. .................. 307/354
4,072,870  2/1978  Davis .................................. 307/354

FOREIGN PATENT DOCUMENTS 0014517  1/1987  Japan .................................. 307/359

Primary Examiner—Eugene R. LaRoche
Assistant Examiner—Evelyn A. Lester

Attorney, Agent, or Firm—Staas & Halsey

[57] ABSTRACT

A comparator circuit including a reference-voltage generating unit for generating a variable reference voltage, and a comparator having a first input terminal to which an input signal is supplied and a second input terminal to which the variable reference voltage from the reference-voltage generating unit is supplied. The comparator circuit also includes additional-voltage generating unit for generating an additional voltage that varies in proportion to the variable reference voltage, and a switching unit that is connected to the additional-voltage generating unit and activated or deactivated in response to an output of the comparator. When the switching unit is deactivated, the input signal is supplied to the first input terminal of the comparator and the variable reference voltage from the reference-voltage generating unit is supplied to the second input terminal of the comparator. When the switching unit is activated, the additional voltage from the additional-voltage generating unit is added to the input signal, and the sum of the input signal and the additional voltage is supplied to the first input terminal of the comparator so that an interpretation processing of the comparator is performed with a variable hysteresis characteristic corresponding to the additional voltage that varies in proportion to the variable reference voltage.

9 Claims, 3 Drawing Sheets

COMPARATOR CIRCUIT WITH VARIABLE HYSTERESIS CHARACTERISTIC

FIELD OF THE INVENTION

The present invention relates in general to a comparator circuit, and in particular to a comparator circuit with a variable detection level (variable hysteresis).

DESCRIPTION OF THE PRIOR ART

Semiconductor ICs (integrated circuits) in recent years are required to have a multifunction, so a comparator circuit has been developed which has a variable detection level (variable hysteresis). Comparator circuits are employed in various industrial fields, and the width of hysteresis is required to be varied appropriately. For example, such comparator circuits are used to compare an input signal of the sensor of a machine tool with a reference value.

By way of example, a conventional comparator circuit with hysteresis is shown in FIG. 1. In the figure, reference numeral 4 denotes an amplifier, which comprises an op amp (operational amplifier) 1 and resistors 2 and 3. The amplifier 4 amplifies an input signal and outputs its output signal Va to one input terminal of a hysteresis comparator 5. As the input signal, for example, a detection signal detected by the sensor of a robot and the like is employed. A reference power source 6 supplies a reference voltage $V_{REF}$ to the op amp 1 and also to the hysteresis comparator 5. The reference voltage of the hysteresis comparator 5 is determined by a constant-current source 7, a variable resistor 8 and the reference power source 6. That is, if it is assumed that the current of the constant-current source 7 is $I_1$ and the resistance value of the variable resistor 8 is $R_V$, the reference voltage to be applied to the hysteresis comparator 5 will become:

$$V_{REF;} + I_1 \times R_V$$

This reference voltage ($V_{REF} + I_1 \times R_V$) is used as a detection level for comparison, as shown in FIG. 2. As shown in FIG. 3, the hysteresis comparator 5 compares an input signal Vin and outputs a binary signal Vo, which will go to a logic high level or logic low level, in accordance with the result of the comparison. The interpretation of the comparison is performed with the hysteresis width of δV shown in FIG. 3. Therefore, even if the input signal Vin contains a noise component in the vicinity of the reference value Vr, the influence caused by the noise component is removed appropriately and therefore the interpretation of the comparison is done with high accuracy.

In the conventional comparator circuit described above, the detection level for comparison can be varied by the constant-current source 7 and variable resistor 8. However, when an input signal from a sensor has a very small amplitude and therefore the high and low levels of the input signal are within the hysteresis width, there is the problem that the comparison cannot be performed and thus the comparator performance is deteriorated, because the hysteresis width of the conventional comparator circuit is fixed.

Accordingly, it is an object of the present invention to provide an improved comparator circuit which is capable of setting an appropriate hysteresis in accordance with a detection level and enhancing the comparator performance by performing a comparison processing even when the amplitude of an input signal is relatively small.

SUMMARY OF THE INVENTION

In order to achieve the above object, as shown in FIG. 4, a comparator circuit according to the present invention comprises a reference-voltage generating means 50 for generating a variable reference voltage, a comparator 51 having a first input terminal to which an input signal is supplied and a second input terminal to which the variable reference voltage from the reference-voltage generating means 50 is supplied, an additional-voltage generating means 52 for generating an additional voltage that varies in proportion to the variable reference voltage, and a switching means 53 that is connected to the additional-voltage generating means 52 and turned on and off in response to an output of the comparator 51. When the switching means 53 is turned off, the input signal is supplied to the first input terminal of the comparator 51 and the variable reference voltage from the reference-voltage generating means 50 is supplied to the second input terminal of the comparator 51. When the switching means 53 is turned on, the additional voltage from the additional-voltage generating means 52 is added to the input signal, and the sum of the input signal and the additional voltage is supplied to the first input terminal of the comparator 51 so that an interpretation processing of the comparator is performed with a variable hysteresis proportion to the variable reference voltage.

The above-described reference-voltage generating means 50 may comprise a resistor connected to the second input terminal of the comparator and a reference power source, the variable reference voltage being generated by passing a first constant current, the magnitude of which is variable, through the resistor connected to the second input terminal of the comparator. The above-described additional-voltage generating means 52 may comprise a resistor connected to the first input terminal of the comparator 51, the additional voltage being varied by passing a second constant current, the magnitude of which is variable, through the resistor connected to the first input terminal of the comparator 51. The above-described comparator circuit further may comprise a current mirror and a voltage-current conversion circuit which vary the magnitudes of the first and second constant currents in such a manner that the additional voltage varies in proportion to the variable reference voltage. The above-described switching means 53 may comprise a transistor.

In the present invention, the interpretation processing of the comparator circuit is performed with a variable hysteresis corresponding to the additional voltage that varies in proportion to the variable reference voltage. Accordingly, an appropriate hysteresis can be set in accordance with a detection level. Even if an input signal is very small in amplitude, the interpretation processing of the comparison is performed with the appropriate hysteresis and the performance of the comparator circuit thus enhanced.

In accordance with another important aspect of the present invention, there is provided a comparator circuit comprising: a current supply means for supplying a first constant current and a second constant current, the magnitudes of the first and second constant currents being variable; a reference-voltage generating means for generating a variable reference voltage; a comparator having a first input terminal to which an input signal is supplied and a second input terminal to which the variable reference voltage form the reference-voltage generating means; first and second resistors connected in series to the first input terminal of the comparator; and a switching means that is turned on and off in response to an output of the comparator. The second constant current is supplied through a backflow prevention means to the midpoint between the first and second resistors and also to the switching means. When the switching means is turned off, by passing the second constant current through the switching means, the input signal is supplied to the first input terminal of the comparator and the reference voltage from the reference-voltage generating means is supplied to the second input terminal of the comparator. If the switching mean is turned on, by supplying the second constant current to the midpoint between the first and second resistors through the backflow prevention means, a voltage drop caused as the second constant current passes through the first resistor is added to the input signal, and the sum of the input signal and the voltage drop is supplied to the first input terminal of the comparator so that an interpretation processing of the comparator is performed with a variable hysteresis corresponding to the voltage drop.

The above described current supply means may comprise first, second and third transistors constituting a current mirror, and a voltage-current conversion circuit for converting a constant voltage to a third constant current, the first and second constant currents being generated in the second and third transistors of the current mirror by passing the third constant current through the first transistor of the current mirror, and the magnitudes of the first and second constant currents being varied by varying the magnitude of the third constant current that is varied by varying the constant voltage. The above-described reference-voltage generating means may comprise a resistor connected to the second input terminal of the comparator and a reference power source, the variable reference voltage being generated by passing the first constant current through the resistor connected to the second input terminal. The above-described backflow prevention means may comprise a diode. The above-described switching means may comprise a transistor.

BRIEF DESCRIPTION OF THE DRAWINGS

The drawbacks of a conventional comparator circuit and the features and advantages of a comparator circuit according to the present invention will be more clearly understood from the following description taken in conjunction with the accompanying drawings.

DESCRIPTION OF THE PREFERRED EMBODIMENTS

Figure 1:
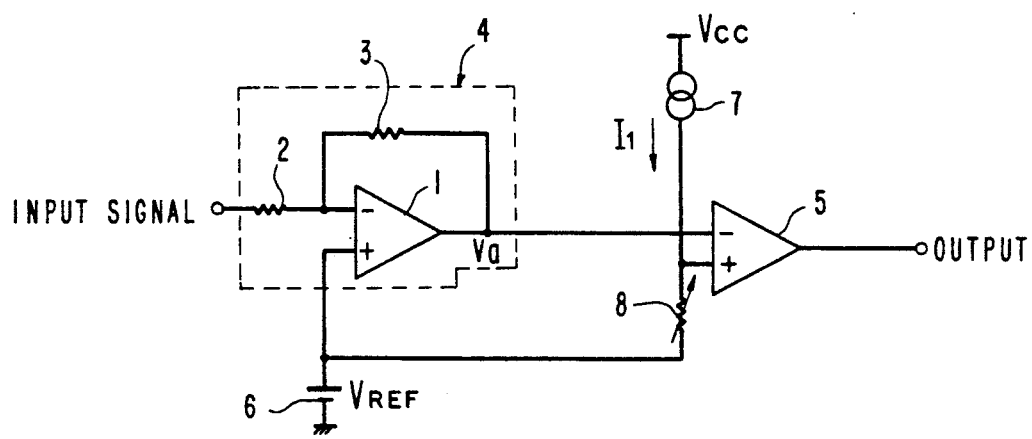
FIG. 1 is a schematic view showing a conventional comparator circuit.
Figure 2:
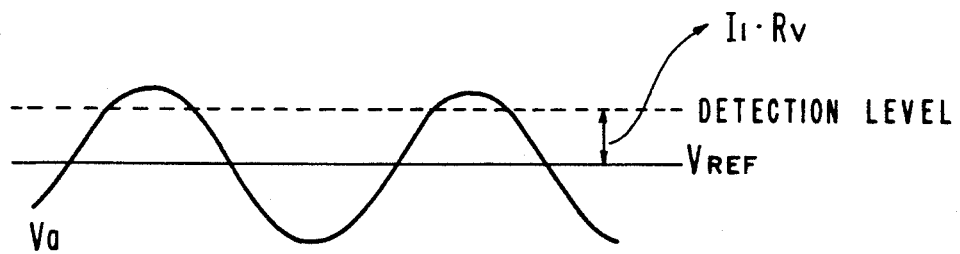
FIG. 2 is a waveform diagram used to explain the comparison processing of the conventional comparator circuit of FIG. 1.
Figure 3:
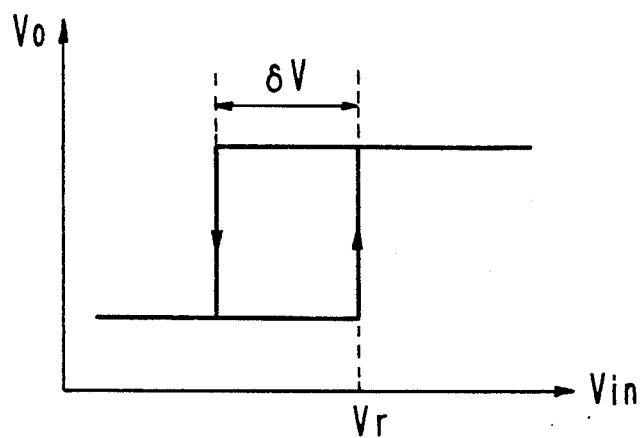
FIG. 3 is a diagram used to explain the hysteresis of the conventional comparator circuit of FIG. 1.
Figure 4:
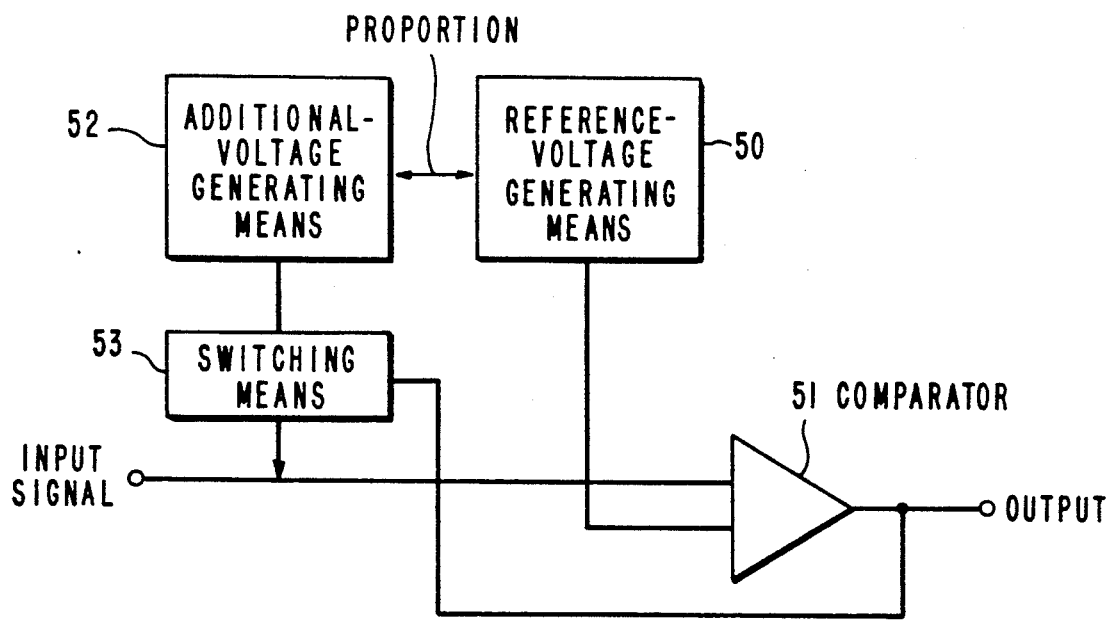
FIG. 4 is a schematic view used to explain the principles of a comparator circuit according to the present invention.
Figure 5:
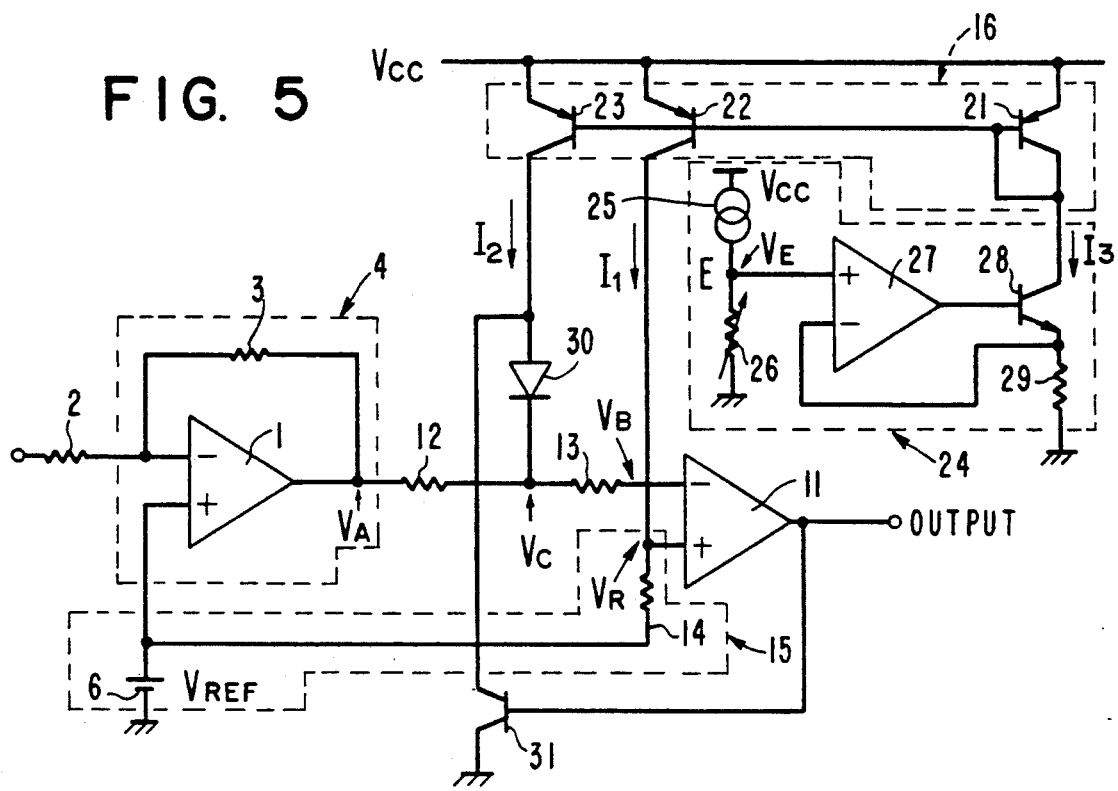
FIG. 5 is a schematic view representing an embodiment of the comparator circuit according to the present invention.

With reference to FIG. 5, there is shown a preferred embodiment of a comparator circuit constructed in accordance with the present invention. The same reference numerals and characters will be applied to the same parts as those of the conventional comparator circuit of FIG. 1 and therefore a detailed description of the same parts will not be given.

In FIG. 5, reference numeral 11 denotes a comparator of the normal type which does not have hysteresis. An output signal $V_A$ of an amplifier 4 is supplied through first and second resistors 12 and 13 to one input terminal of the comparator 11. To the other input terminal of the comparator 11 is supplied a reference voltage $V_R$ for an interpretation of comparison. The comparator 11 compares a signal $V_B$ to be applied to the one input terminal thereof with the reference voltage $V_R$, and outputs a binary signal, which will go to a logic high level or logic low level, in accordance with the result of the comparison. The reference voltage $V_R$ is determined by a first constant current $I_1$, a resistor 14 and a reference power source 6 (reference voltage is $V_{REF}$), and if the resistance value of the resistor 14 is expressed in terms of $R_V$, the reference voltage $V_R$ to be applied to the comparator 11 will become:

$$V_{REF} + I_1 \times R_V$$

The reference voltage $V_R$ is used as a detection level of the comparator 11. The above-described resistor 14, reference power source 6 and first constant current $I_1$ as a whole constitute a reference-voltage generating means 15.

The first constant current $I_1$ is supplied by a current supply means 16, which comprises transistors 21, 22 and 23 constituting a current mirror and a voltage-current conversion circuit 24. The voltage-current conversion circuit 24 comprises a constant-current source 25, a variable resistor 26, an operational amplifier 27, a transistor 28 and a resistor 29. The voltage-current conversion circuit 24 controls the operation of the transistor 28 with a negative feedback control by the operational amplifier 27, and generates a constant current $I_3$, depending on the voltage $V_E$ in the point E of FIG. 5. The constant current $I_3$ flows through the transistor 21 constituting the current mirror. The other transistors 22 and 23 constituting the current mirror generate first and second constant currents $I_1$ and $I_2$, respectively, depending on the constant current $I_3$ flowing through the transistor 21. The first and second constant currents $I_1$ and $I_2$ are supplied to the comparator 11. Note that the magnitude of the constant current $I_3$ can be varied in accordance with the voltage $V_E$ in the point E. This is done by adjusting the resistance value of the variable resistor 26. Consequently, the magnitudes of the first and second constant currents $I_1$ and $I_2$ are varied by varying the resistance value of the variable resistor 26. The magnitude ratio between the first and second constant currents $I_1$ and $I_2$ is determined by the sizes of the transistors 22 and 23.

The first and second resistors 12 and 13 are connected in series and disposed between an operational amplifier 1 and the comparator 11. The second constant currents $I_2$ is supplied through a diode 30 (backflow prevention means) to the midpoint between the first and second resistors 12 and 13 (the voltage in the midpoint is $V_C$)

and also to the collector of a transistor 31. The transistor 31 functions as a switching means and has a base to which the output of the comparator 11 is applied. Depending on the comparator output (logic high or logic low), the transistor 31 is turned on and off so that it allows the second constant current $I_2$ to pass therethrough or prevents the second constant current $I_2$ from passing therethrough.

The operation of the comparator circuit will hereinafter be described in detail.

When the output of the comparator 11 goes from a logic high level to a logic low level, a high-level signal is applied to the base of the transistor 31 and therefore the transistor 31 is turned on. Consequently, the second constant current $I_2$ flows through the transistor 31. When this occurs, there is no backflow current path from the midpoint between the first and second resistors 12 and 13 to the transistor 31, since the diode 30 is provided. Therefore, only the signal from the amplifier 4 is supplied to one input terminal of the comparator 11 and the reference voltage ($V_{REF} + I_1 \times R_V$) set by the reference-voltage generating means 15 is supplied to the other input terminal of the comparator 11. The comparison processing is performed as usual, and the output of the comparator 11 goes from a logic high level to a logic low level.

When, on the other hand, the output of the comparator 11 goes from a logic low level to a logic high level, a low-level signal is applied to the base of the transistor 31 and therefore the transistor 31 is turned off. Since the transistor 31 is turned off, the second constant current $I_2$ is supplied through the diode 30 to the midpoint between the first and second resistors 12 and 13 and then flows to the amplifier 4. At this time, the voltage drop caused as the second constant current $I_2$ passes through the first resistor 12 is added to the signal $V_A$, and the voltage drop and signal $V_A$ is applied to one input terminal of the comparator 11.

If the resistance value of the first resistor 12 is expressed in terms of $R_A$, the voltage drop described above will become:

$$R_A \times I_2$$

Figure 6:
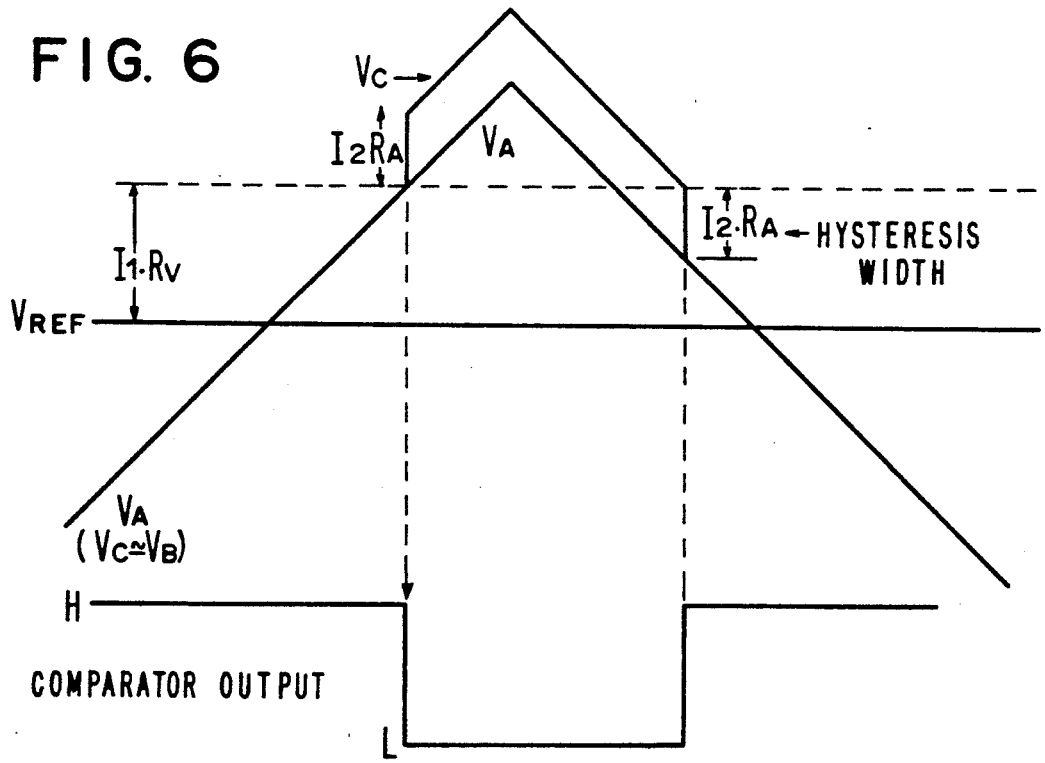
FIG. 6 is a diagram used to explain the hysteresis of the comparator circuit according to the present invention.

In FIG. 6, the voltage $V_C$ in the midpoint between the first and second resistors 12 and 13 rises to a greater level than the signal $V_A$ by the voltage amount ($R_A \times I_2$), and the reference voltage ($V_{REF} + I_1 \times R_V$) for a detection level does not vary. Therefore, if the signal $V_B$ applied to one input terminal of the comparator 11 does not drop by an amount of the voltage drop ($R_A \times I_2$), the interpretation output of the comparator 11 will not change, as shown in FIG. 6. Consequently, the voltage drop ($R_A \times I_2$) becomes, in effect, a hysteresis characteristic for the comparator circuit. The interpretation processing of the comparator 11 is performed with the hysteresis width of ($R_A \times I_2$), and the comparator output goes from a logic low level to a logic high level when the signal $V_B$ drops by an amount of the voltage drop ($R_A \times I_2$), as shown in FIG. 6. In that case, the voltage drop ($R_A \times I_2$) varies according to the magnitude of the second constant current $I_2$, and the detection level varies according to the magnitude of the first constant current $I_1$. Therefore, if there is a certain correlation between the first and second constant currents $I_1$ and $I_2$ (for example, if $I_2$ varies in proportion to $I_1$), the hysteresis width can be varied according to the detection level.

The correlation between the first and second constant currents $I_1$ and $I_2$ will hereinafter be described in detail.

The first and second constant currents $I_1$ and $I_2$ are adjustable by varying the magnitude of the constant current $I_3$ of the current supply means 16, and this is done by adjusting the resistance value of the variable resistor 26. Therefore, the magnitudes of the first and second constant currents $I_1$ and $I_2$ are varied by varying the resistance value of the variable resistor 26. If it is assumed that the resistance value of the resistor 29 is $R_C$, the constant current $I_3$ will be equal to the voltage $V_E$ divided by the resistance $R_C$:

$$I_3 = V_E/R_C$$

By the relation of $V_R = V_{REF} + I_1 \times P_V$, the ratio of $R_C$ and $R_V$ can be replaced with the ratio of $V_E$ and $V_R$. This means that the hysteresis width can be easily set according to the detection level.

Accordingly, the hysteresis width is automatically set according to the detection level. Even if an input signal has a very small amplitude, the comparison processing can be accurately performed with the automatically set hysteresis width. Consequently, the performance of the hysteresis comparator can be enhanced.

Note that, when in the above embodiment the comparator circuit itself is fabricated as an integrated circuit, only a single external terminal for adjusting the resistance value of the resistor 26 is needed in order to set hysteresis, thereby resulting in a decrease in the number of terminals of an IC. On the other hand, in the conventional comparator circuit, the variable resistor 8 requires two external terminals, so there is the drawback that the number of IC terminals is increased.

Although the invention has been described with a certain degree of particularity, it is understood that the present disclosure has been made only by way of example and that numerous changes in the details of the construction and the combination and arrangement of parts may be made without departing from the scope of the invention as hereinafter claimed.

What we claim is:

1. A comparator circuit comprising:
    reference-voltage generating means for generating a variable reference voltage;
    a comparator coupled to said reference-voltage generating means, having a first input terminal to which an input signal is supplied, a second input terminal to which said variable reference voltage from said reference-voltage generating means is supplied, and an output;
    additional-voltage generating means coupled to said comparator and said reference-voltage generating means, for generating an additional voltage that varies in proportion to said variable reference voltage; and
    switching means coupled to said additional-voltage generating means and said comparator, for selectively providing the additional voltage to be added to the input signal from said additional-voltage generating means, said switching means being activated or deactivated to selectively provide the additional voltage in response to an output of said comparator, and
    when said switching means is deactivated, said input signal is supplied to said first input terminal of said comparator and said variable reference voltage from said reference-voltage generating means is supplied to said second input terminal of said comparator, and when said switching means is activated, said additional voltage from said additional-voltage generating means is added to said input signal, and the sum of said input signal and said additional voltage is supplied to sad first input terminal of said comparator so that an interpretation processing of said comparator is performed with a variable hysteresis characteristic corresponding to said additional voltage that varies in proportion to said variable reference voltage.

2. A comparator circuit as set forth in claim 1, wherein said reference-voltage generating means comprises:
- a resistor connected to said second input terminal of said comparator and a reference power source, said variable reference voltage being generated by passing a first constant current, the magnitude of which is variable, through said resistor connected to said second input terminal of said comparator, and wherein said additional-voltage generating means comprises:
- a resistor coupled to said first input terminal of said comparator, said additional voltage being varied by passing a second constant current, the magnitude of which is variable, through said resistor coupled to said first input terminal of said comparator.

3. A comparator circuit as set forth in claim 2, further comprising:
- a current mirror coupled to said comparator and said switching means, and
- a voltage-current conversion circuit coupled to said current mirror, which varies the magnitudes of said first and second constant currents so that said additional voltage varies in proportion to said variable reference voltage.

4. A comparator circuit as set forth in claim 1, wherein said switching means comprises a transistor.

5. A comparator circuit comprising:
- current supply means for supplying a first constant current and a second constant current, the magnitudes of said first and second constant currents being variable;
- reference-voltage generating means coupled to said current supply means, for generating a variable reference voltage based on the first constant current;
- a comparator coupled to said reference-voltage generating means, having a first input terminal to which an input signal is supplied, a second input terminal to which said variable reference voltage from said reference-voltage generating means is supplied, and an output;
- first and second resistors coupled in series to said first input terminal of said comparator; and
- switching means coupled to said first and second resistor, for selectively providing said second constant current, said switching means being activated or deactivated to selectively provide said second constant current in response to the output of said comparator; and
- backflow prevention means coupled to said first and second resistors and said switching means, for receiving said second constant current from said switching means, and for supplying said second constant current to the midpoint between said first and second resistors, and when said switching means is deactivated, said input signal is supplied to said first input terminal of said comparator and said reference voltage from said reference-voltage generating means is supplied to said second input terminal of said comparator, and when said switching means is activated so that said second constant current is supplied to said midpoint between said first and second resistors through said backflow prevention means, a voltage drop caused by said second constant current passing through said first resistor is added to said input signal, and the sum of said input signal and said voltage drop is supplied to said first input terminal of said comparator so that an interpretation processing of said comparator is performed with a variable hysteresis characteristic corresponding to said voltage drop.

6. A comparator circuit as set forth in claim 5, wherein said current supply means comprises:
- first, second and third transistors constituting a current mirror, and
- a voltage-current conversion circuit connected to the third transistor, for converting a constant voltage to a third constant current passing through the first transistor so that said first and second constant currents are generated in said second and third transistors of said current mirror, and wherein the magnitudes of said first and second constant currents are varied by varying the magnitude of said third constant current that is varied by varying said constant voltage.

7. A comparator circuit as set forth in claim 5, wherein said reference-voltage generating means comprises:
- a resistor connected to said second input terminal of said comparator, and
- a reference power source, said variable reference voltage being generated by passing said first constant current through said resistor connected to said second input terminal of said comparator.

8. A comparator circuit as set forth in claim 5, wherein said backflow prevention means comprises a diode.

9. A comparator circuit as set forth in claim 5, wherein said switch means comprises a transistor.

* * * * *

UNITED STATES PATENT AND TRADEMARK OFFICE
CERTIFICATE OF CORRECTION

PATENT NO. : 5,166,550
DATED : November 24, 1992
INVENTOR(S) : Matsubara et al.

It is certified that error appears in the above-identified patent and that said Letters Patent is hereby corrected as shown below:

Column 1, first equation, delete ";" (semicolon).

Column 2, line 29, after "hysteresis" insert

--corresponding to the additional voltage that varies in--.

Title page, item [57]
IN THE ABSTRACT, line 7, after "includes"

insert --an--.

Signed and Sealed this

Nineteenth Day of October, 1993

Attest:

BRUCE LEHMAN

*Attesting Officer*      *Commissioner of Patents and Trademarks*

UNITED STATES PATENT AND TRADEMARK OFFICE
CERTIFICATE OF CORRECTION

PATENT NO. : 5,166,550

DATED : November 24, 1992

INVENTOR(S) : MATSUBARA et al.

It is certified that error appears in the above-indentified patent and that said Letters Patent is hereby corrected as shown below:

TITLE PAGE: [73] Assignee:

After "Kawasaki", delete "," and insert --; Fujitsu VLSI Limited, Kasugai, both of--.

Signed and Sealed this

Twentieth Day of December, 1994

Attest:

BRUCE LEHMAN

Attesting Officer        Commissioner of Patents and Trademarks